# United States Patent [19]

Izumi

[11] 4,217,536
[45] Aug. 12, 1980

[54] SUPPLY VOLTAGE MONITORING DEVICE FOR AUTOMOTIVE BATTERY

[75] Inventor: Toshio Izumi, Ota, Japan

[73] Assignee: Sawafuji Electric Co., Ltd., Tokyo, Japan

[21] Appl. No.: 899,225

[22] Filed: Apr. 24, 1978

[30] Foreign Application Priority Data

Sep. 14, 1977 [JP] Japan .................. 52/123820[U]
Nov. 22, 1977 [JP] Japan .................. 52/156987[U]

[51] Int. Cl.² ...................... G08B 21/00; H02J 7/00
[52] U.S. Cl. ................................ 320/48; 340/636
[58] Field of Search .................. 320/39, 40, 48; 340/636

[56] References Cited

U.S. PATENT DOCUMENTS

| 3,568,175 | 3/1971 | Schwehr et al. | 320/48 X |
| 3,939,421 | 2/1976 | Barringer et al. | 340/636 X |
| 4,019,112 | 4/1977 | Satoh | 320/48 |

Primary Examiner—Robert J. Hickey

[57] ABSTRACT

A supply voltage monitoring device for an automotive battery comprising an average voltage generation circuit for generating the average voltage of the supply voltage of a battery as a power source for various equipment on board an automobile, a Zener diode conducting when the output voltage of the average voltage generation circuit exceeds the prescribed value, a first transistor connected between the Zener diode and the average voltage generation circuit, a second transistor controlled by the conducting Zener diode, a capacitor controlled for charging and discharging by the output of the second transistor, third transistors controlled by the output voltage of the capacitor, and a light emitting diode controlled for the light emitting state or the non-emitting state by the second transistor or the third transistors, and characterized in that the device is constructed to monitor the supply voltage of the battery by the light emitting state or the non-emitting state of the light emitting diode.

6 Claims, 11 Drawing Figures

SUPPLY VOLTAGE MONITORING DEVICE FOR AUTOMOTIVE BATTERY

BACKGROUND OF THE INVENTION

1. Field of the Invention

This invention relates generally to a supply voltage monitoring device for automotive battery, and more specifically to a supply voltage monitoring device for automotive battery which produces the average voltage of the supply voltage of an automotive battery to control the supply voltage of the battery by the light emitting state or the non-emitting state of a light emitting diode controlled by the average voltage.

2. Description of the Prior Art

In recent years, an increasing number of d-c-powered electric refrigerators, for example, battery-powered electric refrigerators on board a car or a boat, etc. have been used. In these electric refrigerators, cooling is effected by taking heat away from the surroundings by means of refrigerant evaporated in the evaporator. The evaporated refrigerant is recovered and compressed in a compressor for recirculation. To drive the compressor, a vibration type motor, called swing motor, is often used. Since an alternating current is required to drive the vibration type motor, an inverter is used to convert the direct current of the battery into an alternating current. The output characteristic of the refrigerator with respect to the input voltage of the inverter, that is, the output voltage of the battery can be expressed as shown in FIG. 1, for example. In FIG. 1, (A) is a characteristic curve representing the relationship between the d-c input voltage and the cooling capability, (B) is a characteristic curve representing the relationship between the d-c input voltage and the a-c output voltage of the inverter, and (C) a characteristic curve representing the relationship between the d-c input voltage and the a-c output current of the inverter. As is evident from FIG. 1, the a-c output voltage and current of the inverter decrease as the d-c input voltage, that is, the output voltage of the battery drops. This results in a remarkable decrease in the compression capability of the compressor, that is, the cooling capability of the refrigerator. In other words, as the output voltage of the battery lowers, the compressor has to operate for a longer time, increasing the energy consumption of the battery.

When such an electric refrigerator is installed on a so-called leisure vehicle, the supply voltage of the battery, which is connected to various other on-board electrical equipment, is adversely affected by the operating condition of such electrical equipment other than the refrigerator. In addition, the distance between the battery and the electric refrigerator often requires long lead wires connecting them, and a voltage drop in those wires cannot be neglected. When the battery output voltage drops for these reasons, the d-c input voltage of the electric refrigerator also drops, deteriorating the cooling performance. In some extreme cases, the refrigerator apparently operates in good order despite the loss of its cooling capability.

A need exists, therefore, for a means for monitoring the supply voltage of the battery so as to check whether the cooling effect of the refrigerator is properly maintained or lowered. Devices for monitoring the terminal voltage of a battery, etc. using light emitting diodes have been employed for this purpose. However, the supply voltage of an automotive battery as described above often undergoes great changes due to variations in the battery load during running, and particularly sharp kick-like voltage variations at the start of the starter. In monitoring the supply voltage of an automotive battery as described above, therefore, it is necessary to produce the average voltage of the supply voltage without picking up such instantaneous kick-like voltage variations and to cause the light emitting diode to respond with the average voltage only.

SUMMARY OF THE INVENTION

It is an object of the present invention to provide a supply voltage monitoring device suitable for an automotive battery, taking into consideration the above-mentioned problems.

It is another object of this invention to provide a supply voltage monitoring device of automotive battery which monitors the steady state supply voltage by responding with the average voltage of the battery supply voltage.

It is still another object of this invention to provide a stable supply voltage monitoring device which does not unwantedly respond to the sharp kick-like variations of the battery supply voltage.

It is a further object of this invention to provide a supply voltage monitoring device which is capable of detecting and warning a drop in the d-c input voltage to control the cooling state of a vibration type electric refrigerator for use on an automobile.

DETAILED DESCRIPTION OF THE INVENTION

Figure 1:
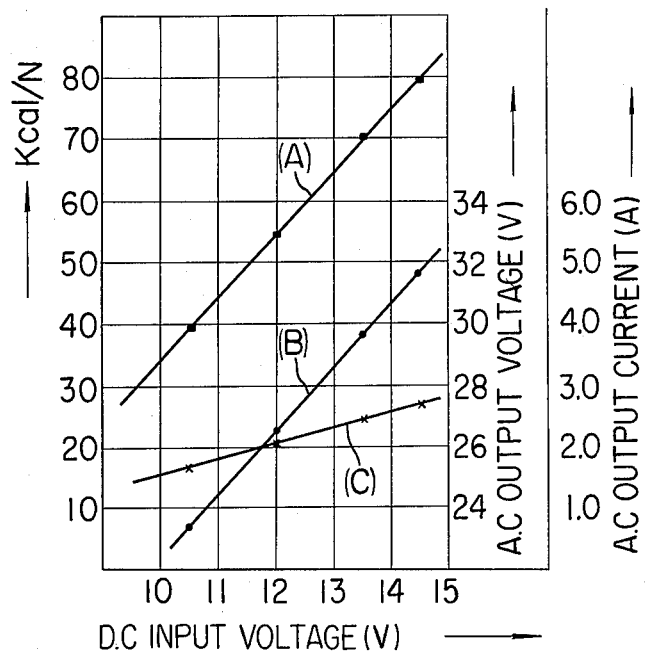
FIG. 1 is a graphical representation showing the characteristic of the d-c input voltage and the output of a vibration type electric refrigerator.
Figure 2:
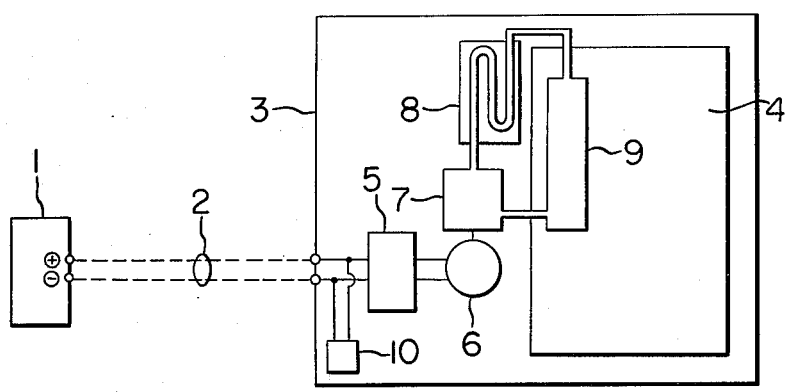
FIG. 2 is a schematic diagram showing a battery supply voltage monitoring device embodying this invention used for controlling the cooling state of a vibration type electric refrigerator.

In FIG. 2, numeral 1 refers to a battery, 2 to a feed wire, 3 to an electric refrigerator, 4 to a refrigerating chamber, 5 to an inverter, 6 to a vibration type motor, 7 to a compressor, 8 to a condenser, 9 to an evaporator and 10 to a battery supply voltage monitoring device, respectively.

In FIG. 2, the electric refrigerator 3 is connected over the feed wire 2 to the battery 1. The d-c power supplied from the battery 1 is converted into an alternating current in the inverter 5 to drive the vibration type motor 6 which in turn drives the compressor 7. Refrigerant compressed by the compressor 7 and condensed by the condenser 8 takes heat away from the refrigerating chamber 4 through vaporization in the evaporator 9 to cool the refrigerating chamber 4. The refrigerant evaporated in the evaporator 9 is fed back to the compressor 7 for compression. In this way, the compressor 7 is operated to maintain the temperature in the refrigerating chamber 4 within the prescribed temperature range.

As will be described later, the battery supply voltage monitoring device 10 is constructed so as to average the battery supply voltage and to indicate a drop in the average voltage below the desired voltage level through visual and/or audio alarms.

Figure 3:
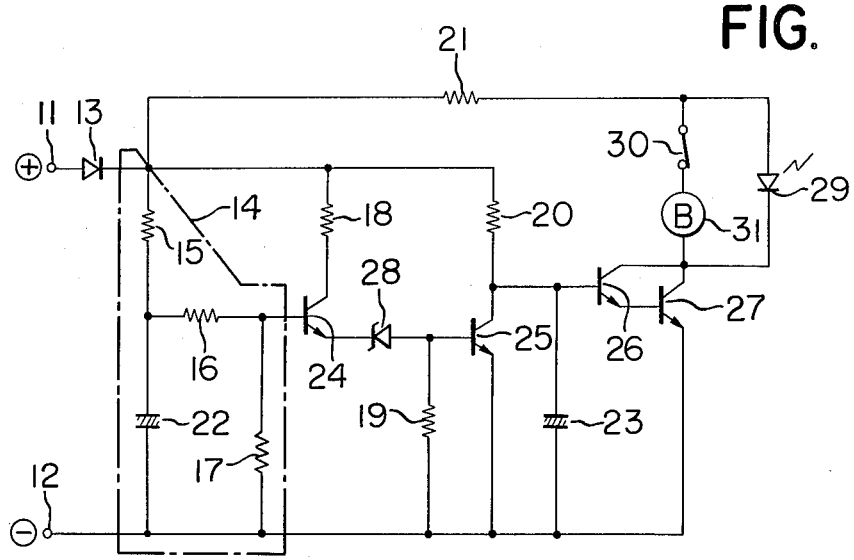
FIG. 3 is a circuit diagram illustrating the construction of a battery supply voltage monitoring device embodying this invention.

FIG. 3 shows a battery supply voltage monitoring device embodying the present invention. In the figure, numeral 11 refers to the positive terminal of a battery, 12 to the negative terminal of the battery, 13 to a diode, 14 to an average voltage generation circuit, 15 through 21 to resistors, 22 and 23 to capacitors, 24 through 27 to transistor, 28 to a Zener diode, 29 to a light emitting diode, 30 to a switch and 31 to a buzzer, respectively.

The battery terminal voltage across the terminals 11 and 12 is inputted to the average voltage generation circuit 14. The diode 13 is connected to the positive side for circuit protection in an accidental connection of the terminals 11 and 12 in reversed polarity. In the average voltage generation circuit, the average voltage of its input, that is, the battery terminal voltage can be outputted by adequately selecting the parameters of the resistors 15, 16, 17 and the capacitor 22 to obtain a suitable time constant of the circuit. Thus, the average voltage generation circuit 14 can output an average voltage by smoothing voltage variations in the battery terminal voltage caused by variations in the load. Furthermore, the circuit 14 smoothes most part of kick-like voltage variations caused at the start of the starter or due to an instantaneous sharp change in the load to produce an output with minimal variations. The ratio of the resistance values of the resistors 15 and 16 and the resistor 17 is properly selected and the Zener diode 28 is connected via the first transistor 24 so that the Zener diode 28 conducts to permit the output voltage to pass when the input, or the battery terminal voltage exceeds the prescribed monitoring voltage value. This eliminates an adverse effect on the time constant of the average voltage generation circuit 14 when the Zener diode 28 is turned on. When the battery terminal voltage exceeds the monitoring voltage value, the Zener diode 28 conducts via the first transistor 24 connected to the output of the average voltage generation circuit 14, causing the second transistor 25 to conduct. When the second transistor 25 is in the ON state, as described above, the third transistors 26 and 27 are in the OFF state, and the light emitting diode 29 is also in the OFF state. This means that the light emitting diode 29 does not light up. In other words, the state where the light emitting diode does not light represents the state the battery terminal voltage is maintained at the prescribed monitoring voltage level.

Assume that the battery terminal voltage drops below the above-mentioned monitoring voltage. Then, the output of the average voltage generation circuit 14 accordingly drops below the Zener voltage of the Zener diode 28, bringing the Zener diode 28 to the OFF state, and the first and second transistors 24 and 25 to the OFF state. When the second transistor 25 is brought to the OFF state, the collector potential of the second transistor 25 is raised to initiate the charging of the capacitor 23. As the charging proceeds, the base voltage of the third transistor 26 also rises, and the third transistors 26 and 27 are brought to the ON state. When the transistors 26 and 27 are turned on, the light emitting diode 29 is turned on to light up. At that time, if the switch 30 is in the ON state, the buzzer 31 begins operating to indicate the lighted state of the light emitting diode 29. In other words, the state where the light emitting diode 29 lights up represents the state where the battery terminal voltage drops below the prescribed monitoring voltage level. Even when the battery terminal voltage drops in a kick-like fashion due to an instantaneous sharp change in the load, the second transistor 25 is brought to the OFF state, causing the collector voltage of the transistor 25 to rise, the third transistors 26 and 27 do not come to operate due to the delay effect of the capacitor 23. Consequently, the light emitting diode 29 is not actuated by an instantaneous change in the battery terminal voltage. This means that the device of this invention monitors only the steady state voltage drop of the battery.

Figure 4:
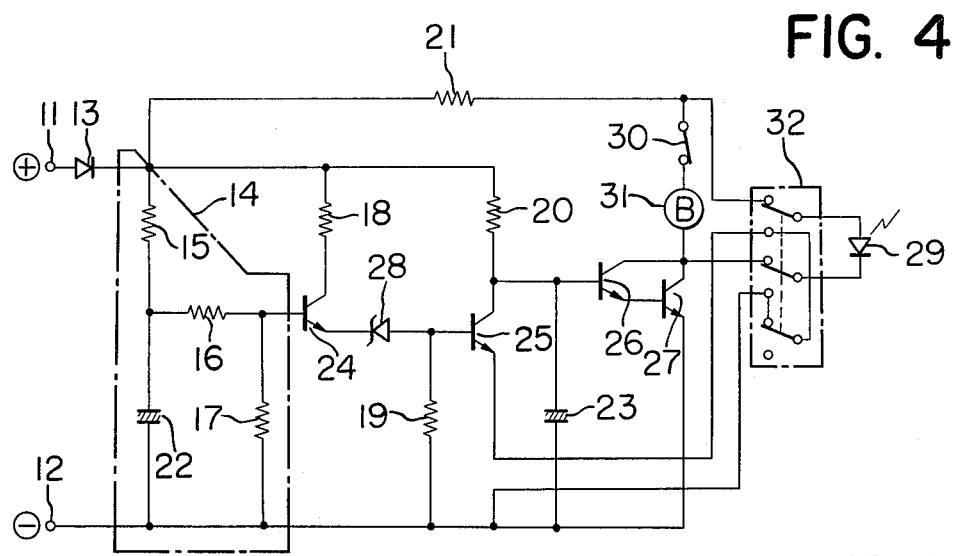
FIGS. 4 and 5 are circuit diagrams illustrating the constructions of other embodiments of this invention.

FIG. 4 illustrates another embodiment of the battery supply voltage monitoring device of this invention. In this embodiment, provision is made to change over the connection of the light emitting diode 29 from the output circuit of the second transistor 25 to the output circuit of the third transistor 27 with a change-over switch.

In the figure, numerals 11 through 31 correspond with the like numerals in FIG. 3, and numeral 32 refers to a changeover switch.

In FIG. 4, the connection of the light emitting diode 29 can be changed over from the output circuit of the second transistor 25 to the output circuit of the third transistors 26 and 27 with the changeover switch 32 while the light emitting diode 29 is fixedly connected to the output of the third transistors 26 and 27 in FIG. 3. For example, when the changeover switch 32 is in the state shown in FIG. 4, the light emitting diode 29 is connected to the output circuit of the third transistors 26 and 27. Thus, the circuit in the figure performs exactly the same operation as that shown in FIG. 3. When the changeover switch 32 is thrown to the opposite side to the side shown in FIG. 4, the light emitting diode 29 is connected to the output circuit of the second transistor 25. In this connection, the light emitting diode 29 is turned on to emit light when the second transistor 25 is in the ON state. In other words, the state where the light emitting diode 29 is in the light emitting state represents the state where the battery terminal voltage is maintained above the prescribed voltage level, since the operation of the circuit itself is the same as that shown in FIG. 3.

Figure 5:
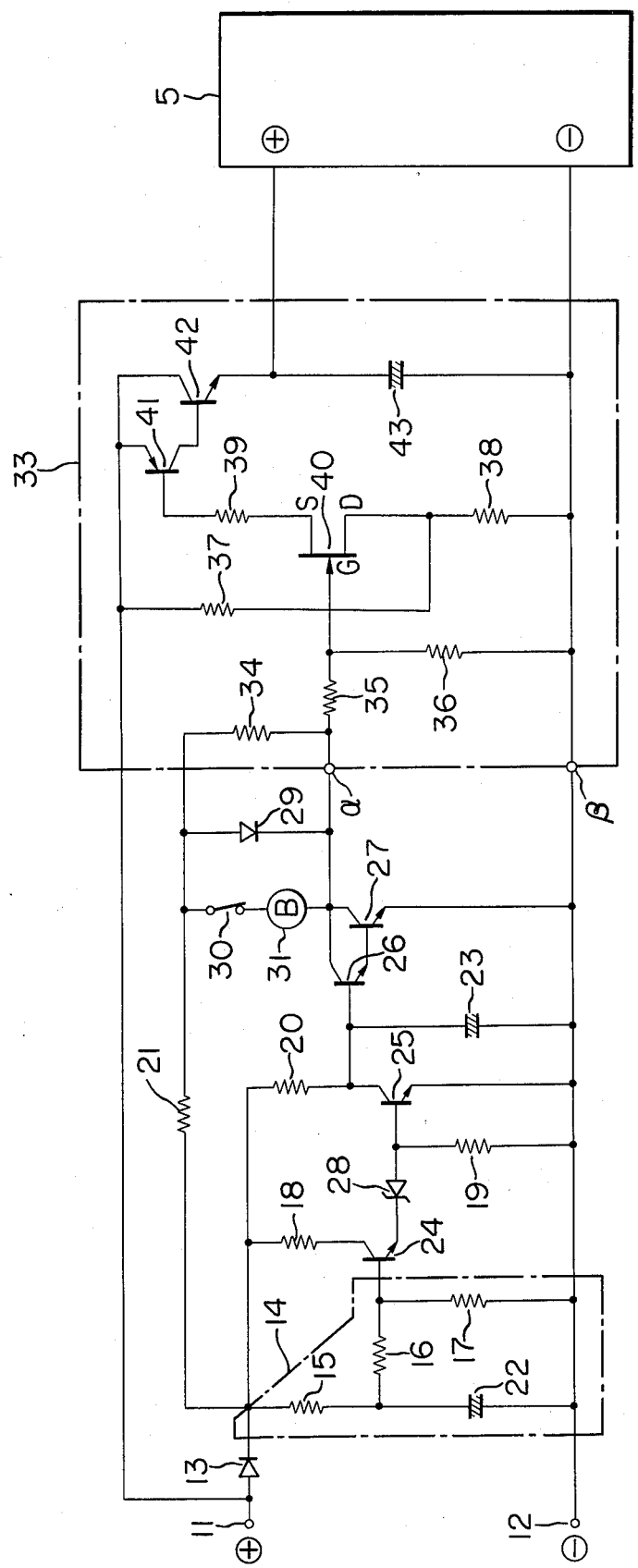

FIG. 5 illustrates still another embodiment of the battery supply voltage monitoring device of this invention, where a switching circuit is provided to switch the load on or off to the output side of the battery supply voltage monitoring device. In the figure, numeral 33 refers to a switching circuit, 34 through 39 to resistors, 40 through 42 to transistors, 43 to a capacitor, and symbols $\alpha$ and $\beta$ refer to the signal output terminals of the third transistors 26 and 27 for external connection. Other numerals and symbols correspond with the like numerals and symbols in FIGS. 2 and 3.

In FIG. 5, as long as the battery terminal voltage is maintained above the prescribed monitoring voltage, the third transistors 26 and 27 are maintained in the OFF state and a positive potential is applied to the gate G of the transistor 40. Consequently, the transistor 40 is maintained in the ON state, and the transistors 41 and 42 are also maintained in the ON state, thus permitting power to be fed to the inverter circuit 5. In this state, the light emitting diode 29 is in the OFF state, or the non-light-emitting state and the buzzer 31 is in the OFF state or the inoperative state. On the other hand, when the battery terminal voltage drops below the prescribed voltage level, the third transistors 26 and 27 are brought to the ON state, reducing the potential at the gate G of the transistor 40 to almost zero and bringing the transistor 40 to the OFF state. This causes the transistors 41 and 42 to turn off, interrupting the power supply to the inverter circuit 5. In this state, the light emitting diode 29 is turned to the ON state to emit light, and the buzzer 31 is also brought to the ON state when the switch 30 is in the ON state. The capacitor 43 has functions to smooth the variations of the battery terminal voltage and to absorb the reactive current component from the output side of the inverter circuit 5, that is, the refrigerator side.

Thus, the battery terminal voltage can be easily monitored by installing the battery supply voltage monitoring device 10, as described above, at a conspicuous position on a refrigerator to facilitate observation from the outside of the refrigerator as shown in FIGS. 6A, 6B, 7A, 7B, 8A and 8B. Numerals 7, 8 and 10 in the figure correspond with like numerals in FIG. 2, and numeral 44 refers to an outer casing of an electric refrigerator.

Figures 6A, 6B:
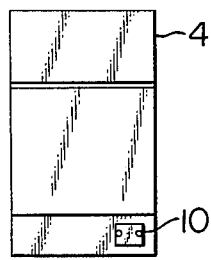
FIGS. 6A and 6B are front and side views of a 2-door type electric refrigerator incorporating a voltage monitoring device of this invention.
Figures 7A, 7B:
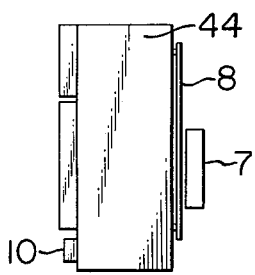
FIGS. 7A and 7B are front and side views of a 1-door type electric refrigerator incorporating a voltage monitoring device of this invention.
Figure 8A:
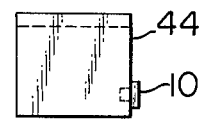
FIGS. 8A and 8B are front and side views of a small electric refrigerator incorporating a voltage monitoring device of this invention.
Figure 8B:
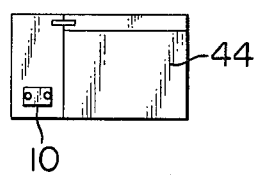

When installing on a 2-door type refrigerator as shown in FIGS. 6A and 6B, the device of this invention can be installed, for example, on a lower part of the outer casing with screws or other suitable fasteners. In the case of a 1-door type refrigerator, it can be installed on part of the door, as shown in FIGS. 7A and 7B. In the case of a small lidded refrigerator with a removable refrigerating box as shown in FIGS. 8A and 8B, which is used as an ice box or a fish container in sport fishing, it can be installed on part of the outer casing. In any case, the monitoring device of this invention can be made of very small size by incorporating integrated circuits, so it can be installed on a small space with screws or other simple fasteners.

In this way, a drop in the input average voltage of a battery-powered refrigerator installed away from the battery can be externally detected, displayed or warned by installing the battery supply voltage monitoring device of this invention on part of the refrigerator. Thus, this simple device can eliminate a failure to notice the deteriorated cooling effect due to a voltage drop. By the use of the device of this invention, a voltage drop can be immediately detected, displayed or warned, and prompt and adequate countermeasures can be taken. The same effect can be achieved by installing the battery supply voltage monitoring device of this invention at a power receptacle exclusively used for the refrigerator.

What is claimed is:

1. A supply voltage monitoring device for automotive battery for monitoring the supply voltage of an automotive battery used as a power source for various on-board equipment, having an average voltage generation circuit for producing the average voltage of the battery supply voltage, a Zener diode which conducts only when the output voltage of the average voltage generation circuit exceeds the prescribed value, a first transistor connected between the Zener diode and the average voltage generation circuit, a second transistor controlled by the conducting Zener diode, a capacitor controlled by the output of the second transistor, third transistors controlled by the output voltage of the capacitor, and a light emitting diode whose light emitting state is controlled by at least the third transistors, and characterized in that the device is constructed so as to monitor the battery supply voltage by the light emitting state of the light emitting diode.

2. A supply voltage monitoring device for automotive battery as set forth in claim 1 wherein the light emitting diode is connected to the output circuit of the third transistors.

3. A supply voltage monitoring device for automotive battery as set forth in claim 1 wherein a changeover switch is provided to change over the connection of the light emitting diode from the output circuit of the second transistor to the output circuit of the third transistors, and vice versa.

4. A supply voltage monitoring device for automotive battery as set forth in claim 1 wherein a switching circuit controlled by the output of the third transistors is provided between the battery and the load powered by the battery for controlling the power supply to the load.

5. A supply voltage monitoring device for automotive battery as set forth in claim 4 wherein signal output terminals are provided on the output side of the third transistors for connecting the output of the third transistors.

6. A supply voltage device for automotive battery as set forth in claim 1 characterized in that the said device is adapted for installation on an outer part of an electric refrigerator powered by a vibration type motor.

* * * * *